United States Patent [19]
Holsinger et al.

[11] Patent Number: 4,758,813
[45] Date of Patent: Jul. 19, 1988

[54] CYLINDRICAL NMR BIAS MAGNET APPARATUS EMPLOYING PERMANENT MAGNETS AND METHODS THEREFOR

[75] Inventors: Ronald F. Holsinger, Carlisle, Mass.; Robert L. Gluckstern, Rockville, Md.; John C. Fisher, Carpinteria, Calif.

[73] Assignee: Field Effects, Inc., Acton, Mass.

[21] Appl. No.: 65,957

[22] Filed: Jun. 24, 1987

[51] Int. Cl.⁴ .................................................. H01F 7/02
[52] U.S. Cl. ...................................... 335/306; 324/318; 29/599; 335/296
[58] Field of Search ............... 335/302, 306, 299, 296; 324/318, 319, 320; 29/599

[56] References Cited

U.S. PATENT DOCUMENTS 4,549,155 10/1985 Halbach ........................... 335/306 X
4,614,930 9/1986 Hickey et al. .................... 335/306 X
4,675,609 6/1987 Danby et al. ..................... 335/306 X Primary Examiner—George Harris
Attorney, Agent, or Firm—Helfgott & Karas

[57] ABSTRACT

NMR bias magnet apparatus employing permanent magnets and methods therefor are provided in accordance with the teachings of the present invention. According to the present invention a plurality of insulating sleeves which may be rotated are disposed about the periphery of a structure having a curvilinear cross section such as a cylinder. Each of the plurality of insulating sleeves are filled with stacks of slabs of permanent magnet material forming slugs and having an anisotropic axis of magnetic orientation aligned at an azimuth corresponding to $a=2\phi$. The length of slug sections or even of individual slabs within each sleeve may be varied for purposes of introducing desired harmonics, as may the manner in which each sleeve is filled, so long as quadrature symmetry is maintained.

35 Claims, 3 Drawing Sheets

U.S. Patent  Jul. 19, 1988  Sheet 1 of 3  4,758,813

CYLINDRICAL NMR BIAS MAGNET APPARATUS EMPLOYING PERMANENT MAGNETS AND METHODS THEREFOR

BACKGROUND OF THE INVENTION

This invention relates to cylindrical bias magnet apparatus for use in nuclear magnetic resonance (NMR) applications and more particularly to cylindrical NMR bias magnet apparatus employing permanent magnets and methods therefor.

The many advantages of nuclear magnetic resonance as an imaging tecnhique for medical and biological purposes have become well known. Conventional NMR imaging systems require a bias magnet for generating a strong uniform magnetic field to promote the alignment of the nuclear magnetic moments of muclei in the specimen material parallel and anti-parallel to the applied field with a slight majority of magnetic moments in the anti-parallel position.

When perturbed from equilibrium, the proton magnetic moments (spins) precess at a frequency which is proportional to the applied field. The frequency of precession is called the resonant frequency. The spins are rotated from equilibrium by a radio frequency coil which produces a magnetic field perpendicular to the main field. The R.F. field alternates at the resonant frequency of the spin.

Spacial localization is achieved with gradient coils which are employed to produce a magnetic field which changes with position. Since the sample protons resonate at a frequency which is proportional to the applied magnetic field, the protons are caused to resonate at a frequency which is proportional to position. Thus the spacial position of each spin is determined by its resonant frequency.

An R.F. receiver is used to detect the signal produced by the precessing magnetic moments and a computer system is used to frequency analyze the signal to produce the resulting image. In addition, tissue contrast is produced by detection of the relaxation time associated with the spins return to equilibrium position. Additional tissue contrast is supplied by detection of a signal decay time constant associated with irrecoverable dephasing caused by magnetic fields produced by adjacent spins.

The magnet system employed to generate the bias field in NMR applications is required to generate a substantial magnetic field in a range typically from 1 to 5 kilogauss and this field must be highly uniform throughout the volume inw hich the specimen under test is disposed. Where human specimens are involved and the NMR system is required to accommodate any portion of the specimen, the bias field must typically be developed across a relatively large bore and uniformly extend for a substantial interval.

From the foregoing, it will be seen that magnetic circuits employed for purposes of producing the bias field are subject to rather onerous requirements which have only been achievable through resort to magnetic circuits which are relatively massive and cost intensive. One approach originally finding great favor due to the large fields available was to employ so-called superconducting magnets for the generation of the bias magnetic field. Here, the actual magnetic structure involved was reasonable in size and weight; however, the operating costs associated with the cryogenic equipment and the maintenance costs thereof tended to be expensive. In addition, in some cases at least, the widely fringing field generated thereby proved to be highly disadvantageous if not outright dangerous.

Magnetic circuits employing permanent magnets were more desirable as not subject to the operating deficiencies and maintenance costs associated with cryogenic systems. Here, however, the resulting magnetic circuits tended to be massive often exhibiting characteristics which greatly restricted their location and, in addition, were excessively costly in manufacture due to the large amount of magnetic material involved and the limited field strength available from conventional magnetic materials. Furthermore, even with the massive magnetic structures involved, resort to costly rare earth alloy magnetic materials was often necessary to achieve desired field strength.

Substantial design effort has been devoted to the development of permanent magnet assemblies for use in producing NMR bias fields in sufficiently large bore configurations to accommodate human specimens. Thus, for instance, U.S. Pat. Nos. 4,498,048 and 4,580,098 as issued on Feb. 5, 1985 and Apr. 1, 1986 to Lee et al. and Gluckstern et al., respectively, and assigned to E.I. duPont de Nemours and Company Inc. disclose a permanent magnet bias system which is formed of a plurality of collars or rings wherein each ring takes the form of a dipole magnet made of permanent magnet material. Each ring or collar comprises precisely located segments of permanent magnet material wherein each segment is formed of a large number of permanent magnet bricks made of rare earth alloy, ferrite ceramic material, or the like, formed into a trapozoidal segment. The segments, once formed, are positioned such that the anisotropic magnet axis thereof is arranged in each ring or collar according to the formula $a = 2\phi$ where $\phi$ is the angle between the radial symmetry line of the segment and the X axis of the dipole ring magnet formed and a is the angle between the anisotropic axis of the segment and the axis. Each segment is magnetized after the segment is formed. The segments are then positioned within a collar or ring so that the entire ring or collar is formed. The segments are tuned by a process of repositioning to eliminate nonuniformities in the dipole magnetic field as determined by a hall effect probe or the like.

In an apparently improved structure, as described in U.S. Pat. No. 4,538,130, as issued on Aug. 27, 1985 to Gluckstern et al. as assigned to Field Effects Inc. of Action, Mass., a ring structure formed of permanent magnets is also disclosed. Here, however, the segments of the ring are formed by four blocks of magnetic material which are already magnetized. The orientation of the anisotropic axis of magnetization of the blocks is such that a dipole ring is again formed with the anisotropic axis of each segment being arranged in the same manner as described in U.S. Pat. Nos. 4,498,048 and 4,580,098. Once the ring is formed tuning for purposes of reducing nonuniformities again occurs. While the structure set forth in U.S. Pat. No. 4,538,130 is substantially simplified over that previously set forth, the machining involved to achieve blocks having the appropriate orientation of the anisotropic axis is highly labor intensive and results in a structure which is quite costly.

A further improvement in permanent magnet bias assemblies for NMR applications is set forth in U.S. Pat. No. 4,639,673 as issued on Jan. 27, 1987 to Heine Zilstra and assigned to U.S. Philips Corporation of New York, New York. Here a ring-type structure is again disclosed wherein permanent magnet segments are disposed about the ring and aligned according to the formula a=2φ. However, each segment is disclosed as taking either the form of a holder having a magnetic bar disposed therein or, alternatively, bars of cylindrical-segment shaped cross section may be employed.

The structure set forth in U.S. Pat. No. 4,639,673 is again simplified over its predecessors and has the advantage that in the process of fine tuning to avoid or reduce field nonuniformities associated with discontinuities in the materials, harmonics or the like, the bars of permanent magnetic material can be rotated either in their sleeves or within the housing. However, again, machining of the magnetic material necessitated by this structure results in the cost of the magnetic material being subject to a multiplier of from four to ten compared with the original cost of the material.

While each of the dipole magnetic structures described above provides a magnetic bias assembly capable of large bore configurations suitable for NMR applications and use magnetic material in a relatively efficient manner, the fabrication costs thereof are extremely high due to the relatively complex structures involved, the large amount of machining required and painstaking assembly steps necessary. Furthermore, while each structure is assembled in a manner to achieve high field uniformity according to the formula a=2φ and may be subsequently fine tuned to reduce measured discontinuities in the field associated with assembly errors, material discontinuities, harmonics or the like, these structures provide only limited capability of tuning wherein additional harmonics useful in reducing the presence of unwanted harmonics may be introduced. In addition, each of these designs would appear to contain at least an implied preference for extremely costly magnetic materials such as rare earth alloys due to the field requirements thereof and the magnetic circuits constructed. Hence, when machining costs are considered, it is not unusual for the costs associated with the magnetic materials utilized to approach $50 a pound with 5,000 to 10,000 pounds of material being involved.

SUMMARY OF THE INVENTION

Therefore, it is a principle object of the present invention to provide improved NMR bias magnet apparatus employing permanent magnets and methods therefor.

A further object of this invention is to provide a cylindrical assembly of individual sleeves forming an NMR bias magnet apparatus employing permanent magnets and methods therefore requiring little, if any, machining of the magnet structures employed.

An additional object of the present invention is to provide an NMR bias magnet apparatus employing permanent magnets which can be tuned to reduce field discontinuities by optimizing the azimuth of the permanet magnet structure therein as well as selectively introducing harmonics useful in reducing the presence of other harmonics.

Another object of the present invention is to provide NMR bias magnet apparatus employing permanent magnets and methods therefor wherein a large bore magnet assembly having other than a circular cross section may be configured.

A further object of the present invention is to provide an NMR bias magnet apparatus employing permanent magnets and methods therefor wherein a uniform field having a varying spacial orientation may be designed by selective introduction of magnetic discontinuities in an axial direction.

Another object of the present invention is to provide an NMR bias magnet apparatus employing permanent magnets and methods therefore utilizing a non-conductive support structure.

Various other objects and advantages of the present invention shall become clear from the following detailed description of several exemplary embodiments thereof and the novel features will be particularly pointed out in conjunction with the claims appended hereto.

In accordance with the teachings of the present invention, NMR bias magnet apparatus employing permanent magnets and methods therefor are provided wherein a plurality of insulating sleeves which may be rotated are disposed about the periphery of a support structure having a curvilinear cross section such as a cylinder, each of said plurality of insulating sleeves being filled with a stack of slabs joined to form a slug of permanent magnet material having an anisotropic axis of magnetization aligned at an azimuth corresponding to a=2φ and wherein the length of slabs within each sleeve may be varied, as may the manner in which each slab is filled, so long as quadrature symmetry is maintained.

BRIEF DESCRIPTION OF THE DRAWINGS

The invention will be more clearly understood by reference to the following detailed description of an exemplary embodiment thereof in conjunction with the accompanying drawings in which:

FIGS. 4A thru 4E illustrate various ways in which the longitudinal extent of permanent magnet slabs may be varied when mounted within an insulating sleeve wherein FIG. 4A represents where all the slabs are tuned together as an entire single slug, FIG. 4B represents a first configuration and FIG. 4C represents a second configuration wherein the slabs can be tuned individually.

DETAILED DESCRIPTION

Figure 1:
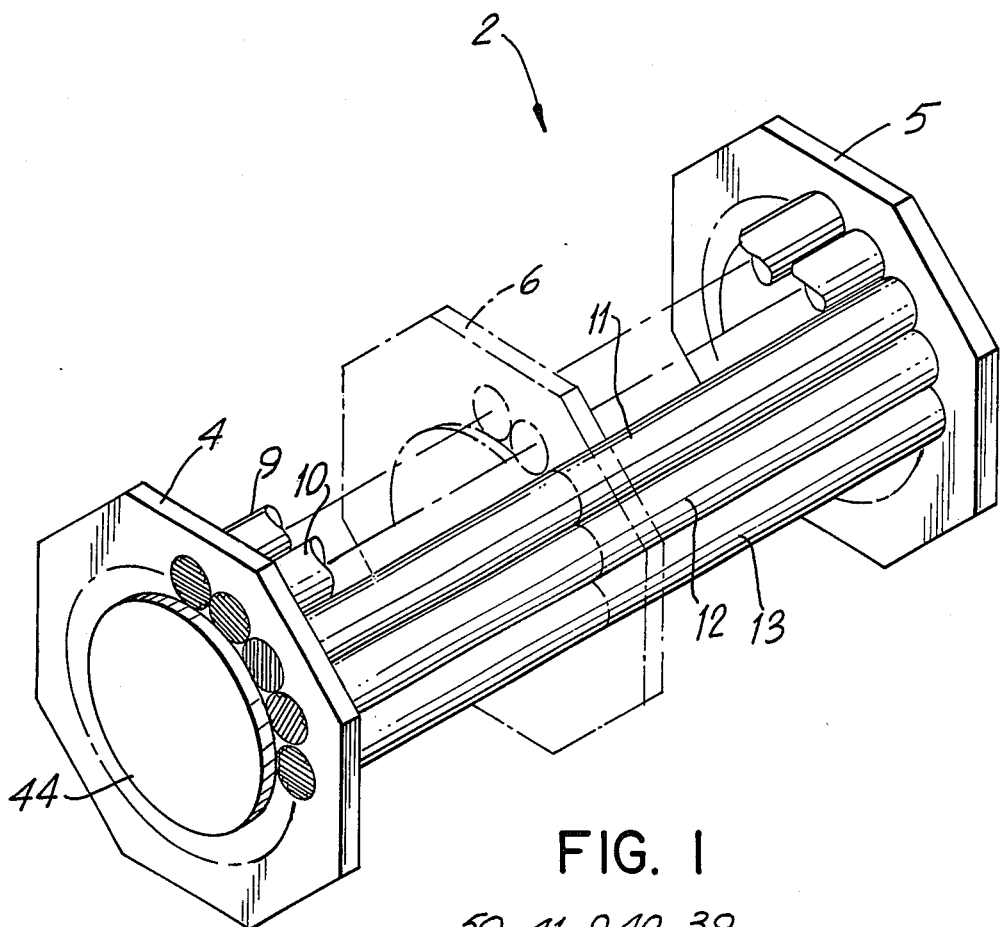
FIG. 1 schematically illustrates a perspective view of an embodiment of cylindrical NMR bias magnet apparatus employing permanent magnets in accordance with the teachings of the present invention.
Figure 2:
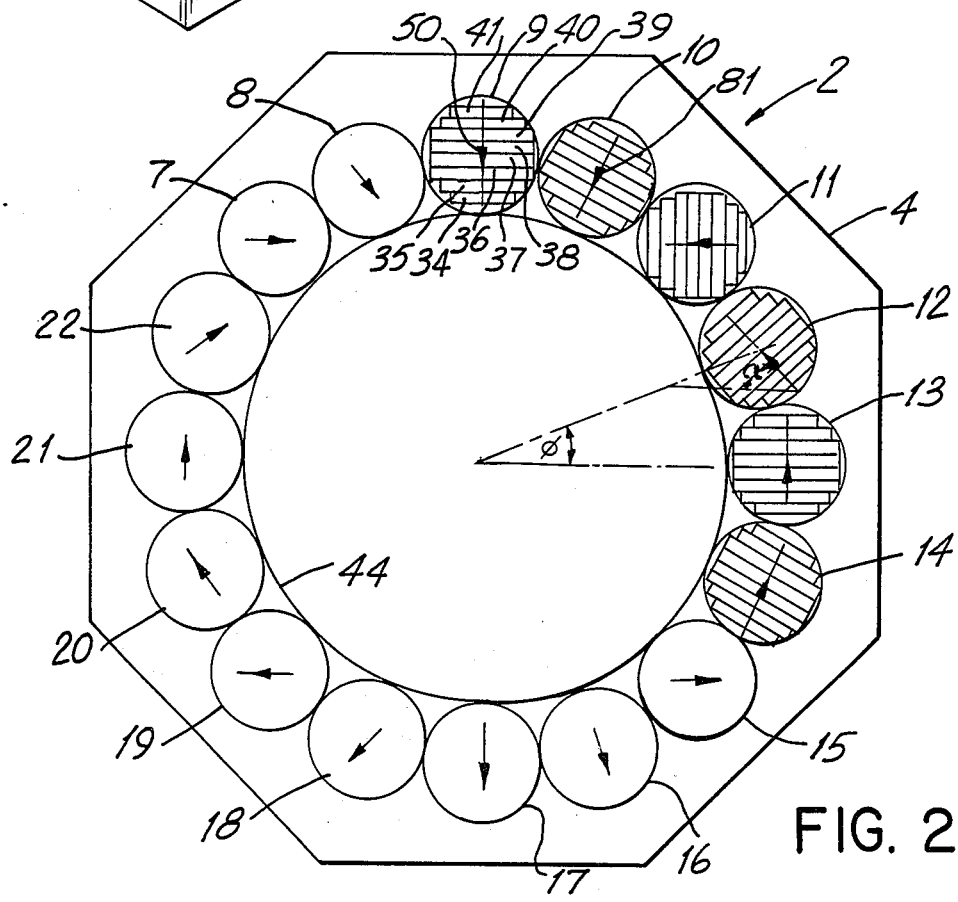
FIG. 2 illustrates a front view of the embodiment shown in FIG. 1.

Referring now to the drawings, and more particularly to FIGS. 1 and 2 thereof, there is shown, respectively, a perspective and a front view of an embodiment of cylindrical NMR bias magnet apparatus employing permanent magnets according to the present invention. The embodiment of the cylindrical NMR bias magnet apparatus illustrated generally at 2 in FIGS. 1 and 2 comprises a pair of spaced apart support plates 4 and 5 at opposing ends with additional support plates such as 6 intermediate thereof, as necessary. A plurality of plastic sleeves 7-22 are respectively inserted within aligned holes provided in the support plates. Each of the plastic sleeves is respectively filled with rectangular slabs of permanent magnetic material 34-41. The slabs are stacked together and joined to form a slug which is inserted into the respective sleeve. The sleeves preferably touch each other and are bonded to the support plates as well as to each other. The support plates may be formed of fiberglass epoxy (E-glass and epoxy) having a central bore 44 with a diameter corresponding generally 33.543 inches, for example, so as to accommodate a human specimen therewithin. The outer periphery of the sleeves may reach a diameter, for example, of 49.803 inches. The sleeves may have a length dimension of approximately 6 feet. While fiberglass and epoxy materials are preferred, other materials may be used as well so long as such materials are nonconductive and thus prevent the formation of any eddy currents. The support plates 4-6 may typically take the form of ¾ inch×54×60 or 72 inch plates.

The plurality of plastic sleeves 9-22 are mounted within the support plates 4-6 in the manner illustrated in FIGS. 1 and 2 so as to form a complete cylindrical ring supported by the plates 4-6.

The plastic sleeves each typically have a diameter of 7.95 inches and a wall thickness of 0.090 although this may be readily varied to suit design preferences. The plastic sleeves also may be formed of fiberglass-epoxy material, such as E-glass and epoxy or the like or, alternatively, polyurethane or any other plastic material exhibiting rigid, non-conductive characteristics may be employed. The wall thickness of the plastic sleeves 9-22, when E-glass and epoxy materials are employed, is about 0.09 inches and the length of each of the plastic sleeves is approximately 6 feet so that the same run the full length of the apparatus.

The sleeves are each individually filled with a stack of the slabs to form a slug. The sleeves are then inserted into the aligned holes in the support plates 4-6. As shall become more apparent as this disclosure proceeds, each of the plurality of plastic sleeves 7-22 are rotatable within the aligned holes in the support plates 4-6 for subsequent tuning. Once placed in a desired position of rotation, the sleeves can be secured to each other and to the support plates with epoxy or other material so that it will no longer be displaced.

Figure 3:
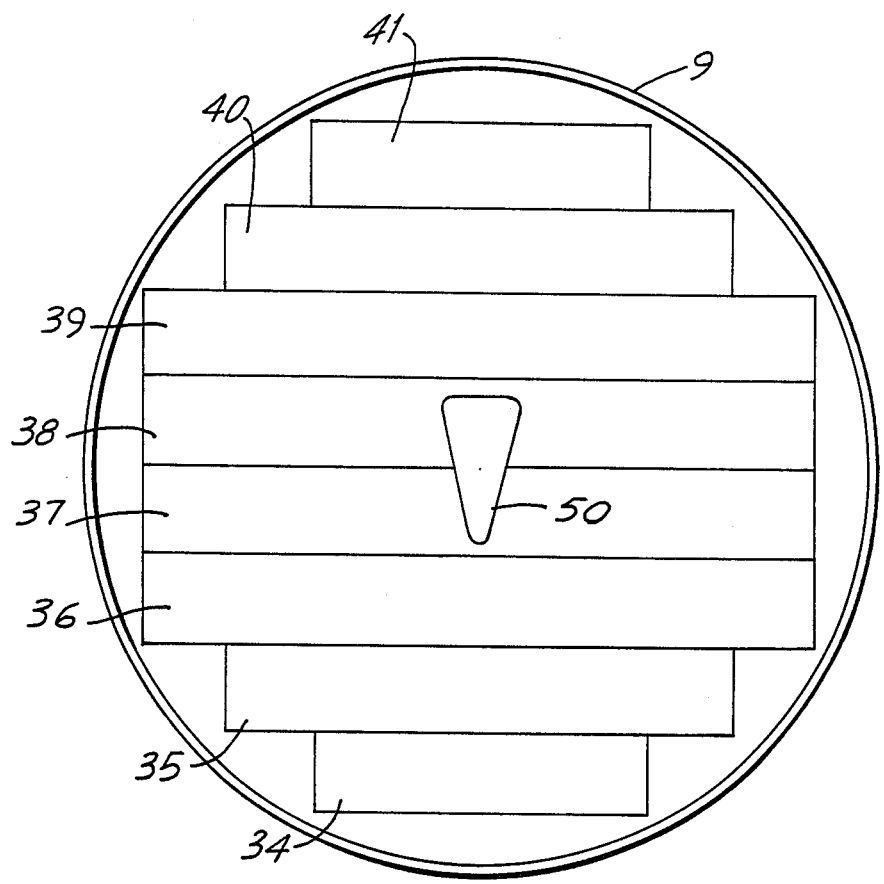
FIG. 3 illustrates the manner in which permanent magnet slabs may be mounted as a slug within an insulating sleeve in accordance with the present invention.

Each of the plurality of plastic sleeves 7-22 is filled with rectangular slabs of permanent magnetic material 34-41 as generally indicated in FIG. 1 and 2 and shown in greater detail in connection with plastic sleeve 9 in FIG. 3. Each of the rectangular slabs of permanent magnetic material 34-41, as illustrated in FIGS. 1, 2 and 3, preferably takes the form of conventionally available ferrite ceramic material which is non-conductive and available in the form of rectangular slabs having a nominal thickness of 1 inch and in varying widths and lengths. Such rectangular slabs of ferrite ceramic material 34-41 are already oriented along their anisotropic axes of magnetization, present in the thickness direction, as generally indicated by the arrowhead 50 illustrated in FIGS. 2 and 3. The slabs are joined together, such as by gluing with epoxy, and formed into a slug. Typically the slug is then placed in a large magnetic field to magnetize the slug along the direction of magnetic orientation. The slug is then inserted into the sleeve. It should be appreciated that the slug could also be magnetized after insertion into the sleeve.

While materials other than ferrite ceramic, such as rare earth alloys, may be employed so long as the same are non-conductive and display substantial MMF along a preferred axis, slabs of ferrite ceramic materials are preferred. This position is taken because slabs of ferrite ceramic, which are already formed and oriented, are available at markedly reduced costs (approximately $1 per pound) while use of materials such as sammarium cobalt, neodymium boron iron, and the like when forming, orientation, and machining costs are considered may have an ultimate cost exceeding $50 per pound. Thus, in the instant invention, prefabricated rectangular slabs of permanent magnet material made of ferrite ceramic may be purchased in a form where the only machining which is required for filling the same into the plurality of plastic sleeves 7-22 is that, as shown in connection with FIGS. 1-3, of cutting the same to desired widths and lengths, it being noted that, frequently standardized, widths and lengths are usable and available.

As shown in FIG. 3, eight rectangular slabs 34-41 of permanent magnet material are placed into each of the plurality of plastic sleeves 7-22 in such a manner that their orientation in the thickness directions is in an aiding relationship and is disposed along the thickness axis of each rectangular slab without need of additional machining to provide a corresponding axis of magnetic orientation for the magnetic characteristics of the resulting plastic sleeve. In FIG. 2 stacks of eight rectangular slabs for plastic sleeves 9-14 have been illustrated while for the remaining sleeves only an arrowhead indicating the anisotropic magnetic orientation axes of the filled and oriented sleeve is indicated. Further, as will be seen in detail in FIG. 3, since the nominal thickness of each rectangular slab 34-41 is a 1 inch slab each plastic sleeve is filled with a stack of eight slabs, four of which (36-39) are of large width, i.e. close to the maximum accommodated by the plastic sleeve while the remaining two rectangular slabs 34, 35, 40 and 41, on either side of the main stack, are somewhat reduced to accommodate the dimensions of the sleeve. It should be appreciated by looking at the arrangement in FIG. 3 that the stack of slabs with the sleeve has quadrature symmetry within the sleeve itself.

While not indicated in FIGS. 2 or 3, portions of the plastic sleeve 9 not occupied by rectangular slabs of permanent magnetic material and may be filled with non-conductive, non-magnetic filler materials such as plastic, fiberglass epoxy or the like, to fix the location of each stack 34-41 of rectangular slabs in a fixed position within its plastic sleeve.

While the number of slabs and the widths thereof within each of the plurality of plastic sleeves 7-22 need not be the same or for that matter be the same for each of the plurality of sleeves 7-22, two design parameters are viewed as important and hence commended to those of ordinary skill in the art. The first is that the plastic sleeve be filled with as much magnetic material as possible. Therefore, the number of slabs utilized and the width graduations thereof should be selected to use as much of the internal space of the plastic sleeve as is reasonably available. The second is that apparatus built in accordance with the instant invention should exhibit quadrature symmetry. Therefore, to achieve such quadrature symmetry while the internal configurations of the magnetic material employed for the sleeves may vary among sleeves each quarter of the resulting cylindrical bias magnetic apparatus illustrated in FIG. 2 should have the same characteristics. Thus, once a specific internal configuration is selected for the plastic sleeve 9, the same should be repeated identically for plastic sleeves 13, 17 and 21. The same requirements also apply to each sleeve within the groups 10, 14, 18 and 22; 11, 15, 19 and 7; and 12, 16, 20 and 8. This is also preferred for the length of each of the rectangular magnetic slabs 34–41 which, as shall be seen below, may be intentionally varied from sleeve to sleeve as well as within each plastic sleeve among the various plastic sleeves for purposes of three-dimensional tuning of the magnetic configuration wherein harmonics may be deliberately introduced so the same may be utilized in the process of reducing the presence of other harmonics.

Thus, for instance, as shown in FIGS. 4A through 4E, the plastic sleeves may each be filled with eight rectangular slabs of permanent magnetic material of corresponding thickness. However, the length of each of the rectangular slabs may be varied in such a manner that while the plastic sleeve exhibits symmetry the magnetic characteristic in the length direction vary for different plastic sleeves within each quadrant.

Figure 4A:
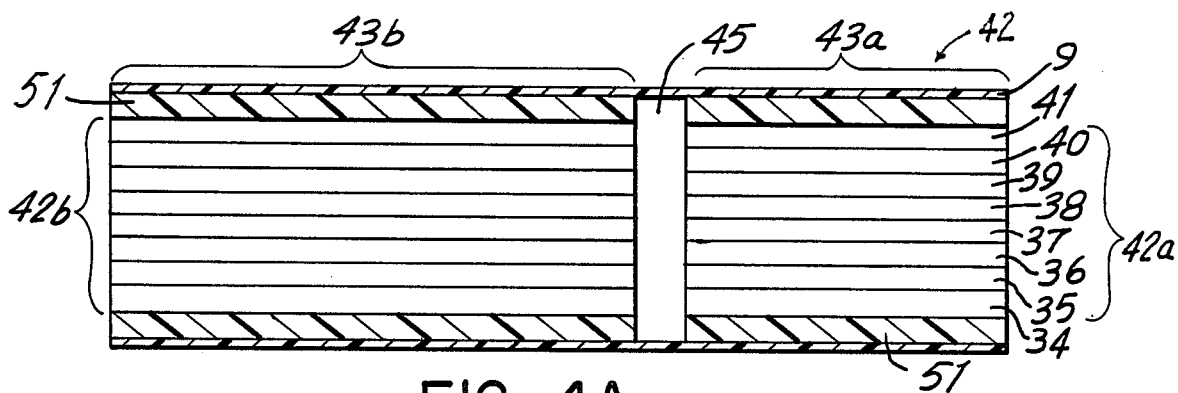

Thus, for instance, as shown in FIG. 4A, the plastic sleeve 9 is shown to include the slabs 34–41 stacked together to form a single slug 42. The slug 42 is inserted into the sleeve 16 to have a first length 43a. This is followed by a spacer 45 after which there is another length of the slug 42b for a length 43b. The sleeve 9 could have multiple lengths of slugs each separated by a spacer. The spacers can be of any non-conductive, non-magnetic material or it could be just empty space. With the arrangement of FIG. 4A, within a sleeve, the stack of slabs or the slub will end in a plane. Each sleeve will differ from the other sleeves in that the axial length and position of the slugs and spacers will differ from sleeve-to sleeve. The planar position of the end of slugs in one sleeve will differ from the end of the slugs in the next sleeve. Also the thickness of the spacers could vary within a sleeve as well as from sleeve to sleeve. However, to maintain quadrature symmetry the sleeves within one quadrant will be identical to the sleeves within the other quadrants.

It is noted that in FIG. 4A, spacer material 51 is used to fill in the gaps in the axial direction where the slug does not fill in the entire periphery of the sleeve 9. Such spacer material need not fill in all over but could be used ony at the openings diametric sides.

Figure 4B:
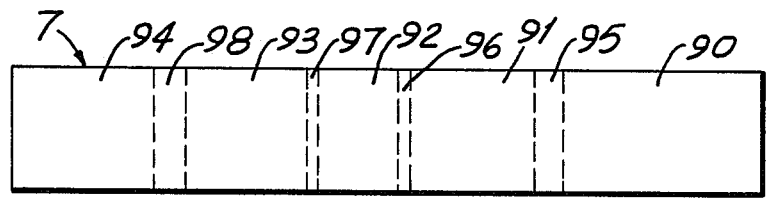
Figure 4C:
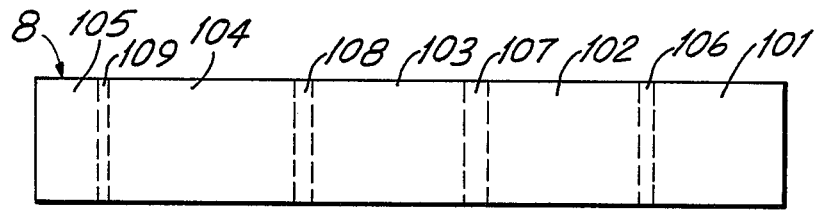

FIGS. 4B and 4C show two sleeves 7 and 8 with different slug arrangements. In sleeve 7 there are the slug sections 90–94 being separated by the spacer sections 95–98. In sleeve 8, there are the slug sections 101–105 separated by the spacer sections 106–109. It is noted that each slug section terminates in a planar end. However, the arrangement in one sleeve differs from the other sleeve. Also, the thickness of the spacers can vary.

Figure 4D:
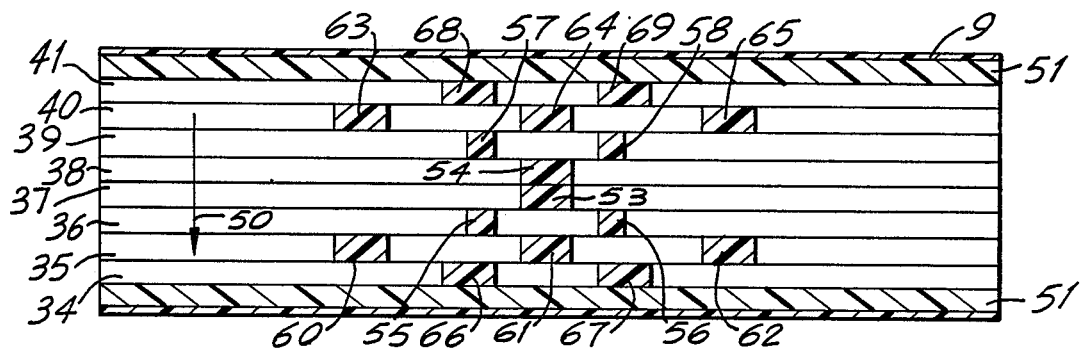
Figure 4E:
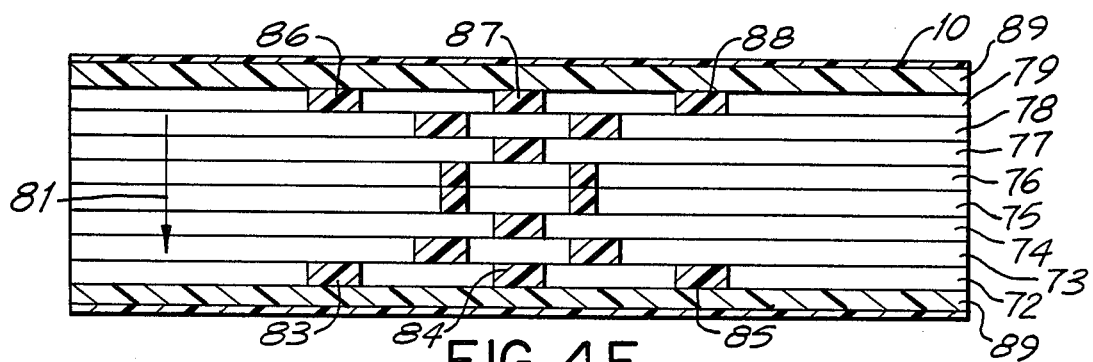

FIGS. 4D and 4E illustrate another manner in which the longitudinal extent of rectangular permanent magnet slabs may be varied when mounted within insulating sleeves 9 and 10. For example, in FIG. 4D sleeve 9 is again shown with spacer material 51 surrounding the stack of rectangular slabs 34–41. The length of the rectangular slabs 34–41 is varied to introduce a magnetic variation in the length direction to achieve the introduction of various harmonics which are usable in reducing the presence of other harmonics. The length graduation selected is arranged in a symmetrical manner. Thus, rectangular elements 37 and 38 are made up of two segments each separated by spacers 53 and 54 which may be formed of the same material as spacing material 51 and, hence, is non-conductive, non-magnetic material formed of plastic or other suitable spacing material. Similarly, in keeping with the symmetrical stacking, rectangular elements 36 and 39 are each formed of three equal length equally positioned slabs of permanent magnetic material separated by spacers 55–58.

The same condition obtains for rectangular slabs 35 and 40 which are formed of four slab elements each separated by spacers 60–65. The stack is completed by rectangular elements 34 and 41 which comprise three elements each of equal length and equally positioned separated by spacers 66–69. Accordingly, those of ordinary skill in the art will appreciate that while each of the slabs 34–41 are varied, the stacking within the sleeve of the rectangular permanent magnet slabs is symmetrical. Further, since quadrature symmetry within the overall cylindrical NMR bias magnet apparatus illustrated in FIGS. 1 and 2 is desired the configuration illustrated in FIG. 4D for plastic sleeve 9 would also be employed for plastic sleeves 13, 17 and 21 although a different configuration may be employed for the remaining plastic sleeves within the quarter.

Such a differing arrangement for sleeve 10 is illustrated in FIG. 4E. In FIG. 4E, rectangular slabs 72–79 are illustrated in a manner in which the same may be stacked to provide the same magnetic orientation, as indicated by the arrowhead 81, and with a length variation for the elements 72–79 which differs from that of plastic sleeve 9 yet providing a symmetrical stack. Thus, as indicated, rectangular slabs 72 and 79 are each formed of three elements which are equally positioned and separated by spacers 83–88 and these last elements within plastic sleeve 10 are spaced from the sleeve by circumferential spacer 89. The same symmetrical arrangement is plainly illustrated for rectangular slabs 73–78 so that a symmetrical arrangement which differs from that shown in FIG. 4D is achieved. The arrangement shown in FIG. 4E for a plastic sleeve 10 would be employed for plastic sleeves 10, 14, 18 and 22 to assure the quadrature symmetry noted which, as well known to those of ordinary skill in the art, insures a reduction in magnetic harmonics introduced into the system. It should be appreciated that the spacers could be just empty space.

Returning now to FIG. 2, it will be seen that each of the plurality of plastic sleeves 7–22 is filled with the rectangular slabs of permanent magnetic material which are aligned in an aiding relationship along their anisotropic axis of magnet orientation, as indicated by the arrows. Further, each plastic sleeve is rotated so that the axis of magnet orientation thereof is aligned according to the formula $a = 2\phi$ to achieve maximum, uniform magnetization in the vertical direction where, as shown in FIG. 2, a or the azimuth is the angle between the X axis and the magnet orientation direction and $\phi$ is the cylindrical coordinate of the plastic sleeve. Additionally, as will be readily appreciated by those of ordinary skill in the art, the term plus or minus pi over 2 is introduced to assure appropriate vertical magnetization for the case illustrated in FIGS. 1 and 2. In the embodiment of the invention illustrated in FIGS. 1 and 2, this is easily achieved since the anisotropic axis of magnet orientation for each of the sleeves 7–22 is in the thickness direction of the rectangular slabs of permanent magnetic material 34–41.

Once the cylindrical NMR bias magnetic apparatus employing permanent magnets is initially oriented in the manner illustrated in FIG. 2, the resulting bias field obtained is measured to ascertain the presence of any discontinuities in the field due to the magnetic material or possible misalignment of the plastic sleeves 7–22. This may be done, as well known to those of ordinary skill in the art, through the use of an NMR field measuring probe or the like. Any non uniformities associated with discontinuities in the material or the presence of harmonics which are larger than designed for are then adjusted by slightly rotating individual ones of the plastic sleeves 7–22 to reorient them in a manner to obtain a maximum uniform field within a cylinder. The fine tuning procedure employed may be conducted as set forth in U.S. Pat. No. 4,538,130, as noted above. The structure and assembly techniques according to the instant invention are considered to result in a 75% reduction in construction costs.

The initial goal in the design of cylindrical bias magnets, as aforesaid, is to align each of the plastic sleeves in a pattern, as aforesaid, where $a_j = 2\phi_j$ for each sleeve, where $\phi_j$ is the angle identifying the position of the j th sleeve and where $a_j$ is the orientation of the magnetization of the j th sleeve as illustrated in FIG. 2. If this is done perfectly for a collection of N sleeves equally spaced around a circumference, the resulting harmonics will be $n = 1, N-1, N+1, 2N-1, 2N+1$— for the magnetic potential. For large values of N, e.g. N equal to or greater than 16, the case shown in FIG. 2, the only harmonic of scalar magnetic potential of consequence is $n = 1$ since the other harmonics will be negligible in the active volume which has a radius typically corresponding to one half of the inner radius of the magnet. The general form of the scalar magnetic potential is then given in cylindrical coordinates by $Y(p,a,z) = \sin a \, F_1(p,z)$ where the term sin a represents the azimuthal (2 pole) harmonic for $n = 1$ and the terms Y, P, Z and $F_1$ mean the scalar magnetic potential, the radial coordinate, the axial coordinate and the function necessary to allow Y to satisfy the required Laplace equation. The main field for magnetic resonance imaging, $B_y$ is $$B_y = \frac{\partial Y}{\partial y} = \sin a \frac{\partial Y}{\partial p} + \frac{\cos a}{p} \frac{\partial Y}{\partial a}$$

$$= \sin^2 a \frac{\partial F_1}{\partial p} + \frac{\cos^2 a}{p} F_1$$

$$= \frac{1}{2}\left(\frac{F_1}{p} + \frac{\partial F_1}{\partial p}\right) + \frac{\cos 2a}{2}\left(\frac{F_1}{p} - \frac{\partial F_1}{\partial p}\right)$$

Thus, the ideal three-dimensional, two pole, cylindrical design will yield azimuthal field harmonics of the order zero and two corresponding to the first and second terms in the above equation. The field cannot therefore be uniform.

However, if, for example, a harmonic $n = 3$ is introduced to the scalar magnetic potential, terms will appear in the field harmomics of the order 2 and 4 through an analysis parallel to that set forth above. In general, the harmonic n in the potential will give rise to harmonics $n-1$ and $n+1$ in the field. Therefore, to produce the best fields, i.e. one with no a dependence, the cos $2a$ term in $B_y$ must be cancelled. To achieve this, a term sin $3a \, F_3(p,z)$ must be added to the scaler magnetic potential. The field $B_y$ will therefore be $$B_y = \frac{1}{2}\left(\frac{F_1}{p} + \frac{\partial F_1}{\partial p}\right) + \frac{\cos 2a}{2}\left(\frac{F_1}{p} - \frac{\partial F_1}{\partial p}\right) +$$

-continued
$$\frac{\cos 2a}{2}\left(3\frac{F_3}{p} + \frac{\partial F_3}{\partial p}\right) + \frac{\cos 4a}{2}\left(\frac{3F_3}{p} - \frac{\partial F_3}{\partial p}\right)$$

Accordingly, it will be seen, that it is possible to design $F_3(p,z)$ so that the two terms in the above equation proportional to cos $2a$ cancel. However, the result is the introduction of a term in $B_y$ proportional to cos $4a$. If the term sin $(5a) F_5(p,z)$ is now added to the scaler magnetic potential which is selected to cancel the cos $4a$ term in the field, a new cos $(6a)$ term is introduced. This can be cancelled by adding a term sin $(7a) F_7(p,z)$ to the potential and this approach, as will be appreciated by those of ordinary skill in the art, may continue. The form of $F_M(p,z)$, $M = 1, 3, 5$, etc. is different for each M since each term cos (Ma) $F_M(p,z)$ must satisfy the basic Laplace equation for potential, leading to $$\frac{\partial^2 F_M}{\partial z^2} + \frac{\partial^2 F_M}{\partial p^2} + \frac{1}{p}\frac{\partial F_M}{\partial p} - \frac{M^2}{p^2} F_M = 0$$

where M equals the harmonic number of the potential it being noted that this equation is different for each M value because of the factor $M^2$.

The implication from the above is that the correction terms cos $(3a) F_3(p,z)$, cos $(5a) F_5(p,z)$, etc. must each have different p,z dependence from the cos a $F_1(p,z)$ term. This requirement of the different z dependence in terms of the different a dependence means that the magnetic material in each of the plastic sleeves which make up the cylinder will ideally have different lengths and different axial positions at each azimuthal position a. Accordingly, the concept of a cylinder having sleeves with stacks of slabs forming slugs of different length making up the sleeve at each azimuth is to be highly preferred.

In the presence of fabrication errors, parallel considerations apply to the axial tuning concept described in connection with FIG. 1. Specifically, the axial position of each rectangular stack of slabs of permanent magnetic material, as shown for example in FIGS. 4A through 4E, may be modified to tune out unwanted harmonics which always will have z dependence. As a result, it will be seen that in the embodiment of the invention illustrated in FIGS. 1 and 2, n sleeves are placed at equal azimuth angles wherein each sleeve contains a plurality of stacks of magnetic slabs and spacers of lengths determined by an "ideal" design and these ideal lengths are different for sleeves having different azimuth positions. Accordingly, in the instant invention, proper tuning consists of rotation, as well as adjustment of the axial position of each of the slug sections in each sleeve, or even of each slab in each plastic sleeve separately. This may be done by precisely measuring the field with an NMR field measuring probe and separately tuning the resulting apparatus one plastic sleeve at a time.

For purposes of such tuning, the slug sections will be individually moved slightly in the axial direction. The spacers can either be empty space to accommodate such axial movement of the slug sections or may be made compressible whereupon additional ferrite slab material may be added to individual elements or, alternatively, portions of the ferrite slab material may be withdrawn and shortened.

While the cylindrical NMR bias magnet apparatus employing permanent magnets illustrated in FIGS. 1 and 2 employs only a single ring of plastic sleeves filled with rectangular permanent magnet slabs, multiple, tier magnet structures having each of the design features and advantages noted in connection with FIGS. 1 and 2 are equally available. For example, referring to FIG. 5 there is shown one quadrant of another embodiment of a cylindrical NMR bias magnet apparatus employing two tiers of sleeves having stacks of rectangular permanent magnet slabs forming slugs and disposed therein. Here, instead of the 16 sleeve magnetic circuit illustrated in FIGS. 1 and 2, a second tier of plastic sleeves containing three sleeves per quadrant or twelve sleeves is indicated. The lower tier for the quadrant shown comprises sleeves 110–113 while the upper tier comprises sleeves 116–118.

In such a case, the sleeves 110–113 would have a diameter approximately 30.1 cm while the plastic sleeves 116–118 would have a diameter of approximately 40.8 cm. The inner bore for the structure, not shown, would be approximately 85 cm while the outside diameter for the structure would be approximately 225 cm. The assembly of sleeves, not shown, would be supported by support plates in precisely the same manner illustrated in FIGS. 1 and 2 and each of the plastic sleeves 110–113 and 116–118 would be filled with stacks of rectangular slabs of permanent magnet material forming slugs precisely in the manner described in connection with FIGS. 1 and 2. In addition, the magnetic orientation of each of the plastic sleeves 110–113 and 116–118 would be as indicated by the arrows 120–126 in accordance with the equation $a = 2\phi$ as described in connection with FIGS. 1 and 2. The sleeves forming the inner tier would be joined together and the sleeves of the inner tier would be joined to the outer tier.

Figure 5:
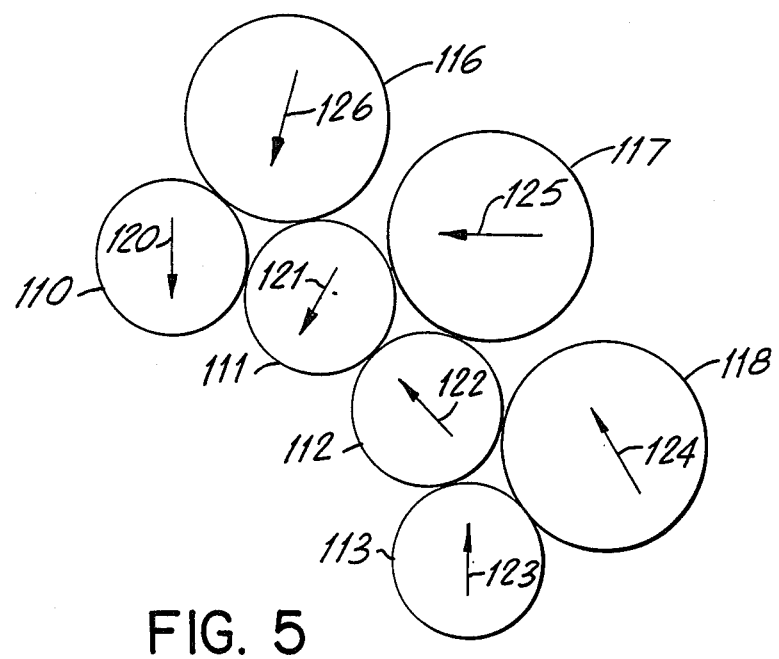
FIG. 5 illustrates a quadrant of a front view of another embodiment of cylindrical NMR bias magnet apparatus employing permanent magnets according to the present invention.

The embodiment of the invention illustrated in FIG. 5 is advantageous in applications where larger bore embodiments of the invention are desired, where fewer plastic sleeves per ring is viewed as advantageous and/or where stronger and more variable field configurations are desired. In the embodiment of the invention illustrated in FIG. 5, the structure of the cylindrical NMR bias magnet apparatus is first assembled according to an ideal field configuration determined by the formula $a = 2\phi$ and an ideal length configuration for the rectangular stacks of slabs within each sleeve of each quadrant, as determined preferably by computer simulation. Thereafter, fine tuning of the structure by measurement of the field configuration, axial rotation of the plastic sleeves and adjustment of the length factors in each quadrant is accomplished in the precise manner described in connection with FIGS. 1 and 2.

While the instant invention has been described in connection with several specific exemplary embodiments thereof, it will be understood that many modifications and variations will be readily apparent to those of ordinary skill in the art. Such modifications and variations will result both from the design considerations involved and various applications envisioned. For instance, under certain circumstances the bias magnet apparatus may achieve better permanent magnet material utilization if the same was provided with an elliptical cross section rather than one which was cylindrical. Under these conditions the spurious magnetic field harmonics introduced by the deviation in cross section may be compensated through a variation in the length of the rectangular slabs in each plastic sleeve in the maner described above. Furthermore, while the instant invention has been principally described in connection with large bore structures suitable for NMR bias magnet applications, those of ordinary skill in the art will appreciate that the design concept as set forth herein are equally applicable to certain forms of particle accelerators or the like. Therefore, it is manifestly intended that this invention be only limited by the claims and the equivalents thereof.

What is claimed is:

1. Magnetic bias apparatus comprising:
    a plurality of elongated sleeves each having a longitudinal axis and being disposed parallel to each other, said sleeves arranged around a closed curvilinear space to define a bore therein, each of said plurality of sleeves being rotatable about its longitudinal axis; and
    a plurality of rectangular permanent magnet slabs mounted in each of said plurality of sleeves, each of said plurality of permanent magnet slabs having a length, width and thickness dimension and being stacked in the thickness dimension within each of said plurality of sleeves with said length dimension parallel to the longitudinal axis, each of said plurality of rectangular permanent magnet slabs having an anisotropic axis of magnetic orientation parallel to said thickness direction and stacked in a magnetically aiding relation in said thickness direction whereby the magnetic field exhibited through at least a portion of said bore may be maximized and rendered more uniform by rotation of said sleeves to a selected orientation.

2. The apparatus according to claim 1 wherein said plurality of sleeves define a cylindrical arrangement including a circular bore.

3. The apparatus according to claim 2 wherein said plurality of sleeves are disposed substantially adjacent one another about said bore and further comprising means for joining each sleeve to its adjacent sleeves.

4. The apparatus according to claim 3 wherein each of said plurality of sleeves is disposed a common radial distance from a central location of said circular bore and is positioned at an angle $\phi$ from a vertical axis of said circular bore.

5. The apparatus according to claim 4 wherien said selected orientation for each of said plurality of sleeves is an orientation wherein said anisotropic axis of magnetic orientation of said plurality of rectangular permanent magnetic slabs stacked within each sleeve exhibits an azimuth a equal to twice said angle $\phi$.

6. The apparatus according to claim 1 wherein said plurality of sleeves are equally spaced about the periphery of said bore and the magnetic field exhibited by said apparatus displays substantial quadrature symmetry.

7. The apparatus according to claim 6 wherein said plurality of sleeves correspond in number to a whole number N where N/4 is also equal to a whole number.

8. The apparatus according to claim 7 wherein the magnetic characteristics of each sleeve within a grouping of N/4 sleeves may vary and the magnetic characteristics of each grouping of N/4 sleeves are substantially the same.

9. The apparatus according to claim 1 wherein at least two of said plurality of rectangular permanent magnet slabs mounted in at least certain ones of said plurality of sleeves are segmented in said length dimension to provide position adjustment of said at least two of said plurality of rectangular permanent magnet slabs in said length dimension.

10. The apparatus according to claim 9 wherein said plurality of rectangular permanent magnetic slabs mounted in each of said plurality of sleeves are symmetrically stacked.

11. The apparatus according to claim 10 wherein said plurality of rectangular permanent magnetic slabs display differing widths.

12. The apparatus according to claim 11 wherein said plurality of permanent magnetic slabs within a sleeve provides a cross sectional arrangement having quadrature symmetry within the sleeve.

13. The apparatus according to claim 12, and further comprising spacer material longitudinally positioned in the sleeve between at least a portion of the periphery of the slab and the sleeve.

14. The apparatus according to claim 13 wherein said spacer is of non-conductive, non-magnetic material.

15. The apparatus according to claim 9 wherein the slabs within each sleeve are stacked together to form slugs, said slugs being sectional longitudinally within each sleeve, and further comprising spacers positioned within the sleeve longitudinally between each adjacent slug section.

16. The apparatus according to claim 15 wherein said spacer material is non-conductive and non-magnetic.

17. The apparatus according to claim 15 wherein said spacer material is air.

18. The apparatus acoding to claim 15 wherein each slug section ends in a planar arrangement.

19. The apparatus according to claim 15 wherein the slug section arrangement differs longitudinally from sleeve to sleeve.

20. The apparatus according to claim 15 and further comprising means for adjusting the longitudinal position of each slug section within its sleeve to permit tuning for elimination of selective harmonics.

21. The apparatus according to claim 1 wherein certain of said plurality of rectangular permanent magnet slabs mounted in at least one fourth of said plurality of sleeves are segmented in said length dimension to provide for introduction of selected harmonics in the magnetic bias apparatus.

22. The apparatus according to claim 1 and further comprising support longitudinally positioned along the length of the assembly of sleeves for supporting the sleeves.

23. Magnetic bias apparatus comprising:
N nonconductive elongated sleeves each having a longitudinal axis, said sleeves disposed parallel to each other and arranged around a closed curvilinear space to define a bore therein, each of said N sleeves being rotatable about an axis parallel to said longitudinal axis;
nonconductive permanent magnet material mounted in each of said N sleeves, said permanent magnet material having a length, width and thickness dimension and exhibiting an anisotropic axis of magnetic orientation parallel to said thickness direction, said nonconductive permanent magnet material being segmented in said length dimension to provide for introduction of selected magnetic harmonics whereby the magnetic field exhibited through at least a portion of said bore may be maximized and rendered more uniform by rotation of said sleeves to a selected orientation; and
where N and N/4 are whole numbers and the magnetic characteristics of each sleeve within a grouping of N/4 sleeves may vary and the magnetic characteristics of each grouping of N/4 sleeves are substantially the same.

24. The apparatus according to claim 23 wherein said plurality of sleeves defining a cylindrical arrangement including a circular bore.

25. The apparatus according to claim 24 wherein each of said N sleeves is disposed a common radial distance from a central location on said circular bore and is positioned at an angle $\phi$ from a vertical axis of said circular bore.

26. The apparatus acording to claim 23 wherein said N sleeves are equally spaced about the periphery of said bore and the magnetic field exhibited by said apparatus displays substantial quadrature symmetry.

27. The apparatus according to claim 24 wherein said permanent magnet material mounted in each of said N sleeves takes the form of a plurality of rectangular magnetic slabs mounted in each of the sleeves, each of said plurality of rectangular permanent magnetic slabs having a length, width and thickness dimension and being stacked in the thickness direction with said length dimension parallel to said longitudinal axis, each of said plurality of rectangular permanent magnetic slabs having an anisotropic axis of magnetic orientation parallel to said thickness direction and stacked in a magnetically aiding relation in said thickness direction.

28. The apparatus according to claim 27 wherein the slabs of each sleeve are respectively stacked together to form a slug, the cross sectional area of the slug within the sleeve having quadrature symmetry.

29. The apparatus according to claim 28 wherein the slug within each sleeve is sectional, slug sections within a sleeve being longitudinally spaced apart by spacers.

30. The apparatus according to claim 28 wherein the longitudinal arrangement of slug sections differs from sleeve to sleeve.

31. The apparatus according to claim 27 wherein at least two of said plurality of rectangular permanent magnet slabs mounted in certain of said N sleeves are segmented in said length dimension to provide position adjustment of said at least two of said plurality of rectangular permanent magnet slabs in said length dimension.

32. A method of fabricating a magnetic bias assembly comprising the steps of:
configuring a plurality of sleeves;
disposing a plurality of rectangular permanent magnet slabs in each of said plurality of sleeves, each of said plurality of rectangular permanent magnet slabs having a length, width and thickness dimension and being stacked in the thickness dimension within each said sleeve, said plurality of rectangular permanent magnet slabs each having an anisotropic axis of magnetic orientation parallel to said thickness direction and stacked in a magnetically aiding relation in said thickness direction within each sleeve;
placing the plurality of sleeves parallel to each other than forming them around a curvilinear space to enclose a bore;
rotatably mounting said plurality of sleeves in said curvilinear space to arrange each of said plurality of sleeves rotatable about an axis parallel to the longitudinal axis of the sleeve; and maximizing the magnetic field exhibited through at least a portion of said bore by rotation of said sleeves to a selected orientation.

33. The method of fabricating according to claim 32 additionally comprising the steps of introducing selected harmonics by employing segmented selected ones of said plurality of rectangular magnet slabs and axially positioning said segmented selected ones within said sleeves.

34. The method of fabricating according to claim 32 wherein said step of rotatably mounting is performed in a manner to produce quadrature symmetry.

35. The method of fabricating according to claim 32 wherein the slabs for each sleeve are stacked together to form a slug, the slug being segmented longitudinally within the sleeve with longitudinal spacers separating adjacent slug sections.

* * * * *